United States Patent [19]

Ahn et al.

[11] 3,852,877

[45] Dec. 10, 1974

[54] MULTILAYER CIRCUITS

[75] Inventors: Junghi Ahn, Wappingers Falls; Bernard Schwartz, Poughkeepsie; David L. Wilcox, Hopewell Junction, all of N.Y.

[73] Assignee: International Business Machines Corporation, Armonk, N.Y.

[22] Filed: Apr. 2, 1974

[21] Appl. No.: 457,302

Related U.S. Application Data

[60] Division of Ser. No. 850,324, Aug. 6, 1969, and a continuation of Ser. No. 538,770, March 30, 1966, abandoned.

[52] U.S. Cl. .................... 29/625, 29/25.42, 75/208, 117/51, 117/61, 156/89, 264/58, 264/113

[51] Int. Cl. .................... H05k 3/10

[58] Field of Search .......... 29/624, 625; 174/68 S, 174/52; 317/101 R, 101 B; 264/154, 58, 59, 61, 65–67, 113; 117/212, 8, 8.5, 38, 51, 54, 61, 66, 93.3

[56] References Cited

UNITED STATES PATENTS

| | | | |
|---|---|---|---|
| 1,051,814 | 1/1913 | Lowendahl | 29/630 E |
| 2,179,960 | 11/1939 | Schwarzkopf | 75/208 X |
| 2,939,059 | 5/1960 | Grauley | 317/258 X |
| 3,189,978 | 6/1965 | Stetson | 29/625 |
| 3,195,027 | 7/1965 | Vandermark et al. | 317/242 |
| 3,223,905 | 12/1965 | Fabricus | 317/258 |
| 3,303,026 | 2/1967 | Zdanuk et al. | 75/208 |
| 3,312,771 | 4/1967 | Hessinger et al. | 174/52 S |
| 3,399,268 | 8/1968 | Schneble et al. | 174/68 S |
| 3,410,714 | 11/1968 | Jones | 117/212 X |

*Primary Examiner*—C. W. Lanham
*Assistant Examiner*—Joseph A. Walkowski
*Attorney, Agent, or Firm*—Wolmar J. Stoffel

[57] ABSTRACT

Multilevel ceramic high conductivity circuit structures are formed by depositing a metallizing media on surfaces of green ceramic sheets, including on walls of holes which extend through the sheets. The metallizing media includes metals and compounds which convert to a metal during firing. The sheets are stacked in registry, laminated into a monolithic structure and heated in a reducing atmosphere to sinter the ceramic to a dense body, and simultaneously fire the metallizing media to form an adherent metal capillary within the body. A high conductivity, low melting point conductor fills the capillary thereby forming a highly conductive circuit member within the multilevel ceramic structure.

7 Claims, 6 Drawing Figures

MULTILAYER CIRCUITS

CROSS-REFERENCE TO RELATED APPLICATION

This is a division, of application Ser. No. 850,324 filed Aug. 6, 1969 and a continuation of application Ser. No. 538,770 filed Mar. 30, 1966 and now abandoned.

BACKGROUND OF THE INVENTION

This invention relates to multilayer circuits, and more particularly, to multilayer ceramic circuits and a method for their manufacture.

The attributes of multilayer circuit boards (e.g., organic insulator-metal conductor laminates) are well known and have been widely adopted by the electronics industry. Such circuit boards provide densities of packaging not heretofore obtainable through any other technique. Nevertheless, as circuit structures, line widths, and components, become increasingly miniaturized, and the power dissipations per unit area increase, it is clear that organic-conductor laminates are reaching the limits of their applicability. As a result, ceramics, with their inherently more stable characteristics are now seeing a much wider application in the field of electronics, and, more particularly in the field of circuit boards.

Ceramic circuit boards exhibit many characteristics not found in the organic-conductor laminates. They are rigid at all temperature and pressure variations to which the circuits are normally subjected. They withstand high temperature processes and thereby allow semiconductors to be joined directly thereto and interconnections to be made thereon without any injury to the underlying ceramic material. They are good thermal conductors, thereby providing increased cooling capacity and, as a result, accommodate higher packaging densities. The technology exists for providing good metal to ceramic bonds thereby allowing conductors to be adhered thereto with high reliability and resultant long life. Finally this material can also be made an integral portion of a hermetically sealed package as a result of its impervious nature.

Notwithstanding the above attributes of the ceramic technology aand the relative ease with which single layer ceramic circuit boards can be made, the production of multilayer ceramic circuit boards with high conductivity conductor lines is another matter. In the production of single layer ceramic circuit boards, the underlying ceramic structure is first formed and sintered before being metallized. As a result, the high sintering temperatures do not affect the conductive metal and any high conductivity metal such as copper or aluminum can be utilized (providing a premetallization has been provided). When however the uncured ceramic substrate is metallized with high conductivity metals and then laminated into a multi-layer structure, the subsequent sintering of the substrate (e.g., at 1,700°C. for an alumina ceramic) causes the high conductivity metal to revert to either its molten or gaseous state. As a result, the metal either vaporizes through the substrate or blows the substrate apart. If the sintering takes place at somewhat lower temperature e.g. 1,200°–1,300°C., the conductor again becomes molten and heads up (de-wets from the surface) thus producing discontinuous circuit lines. As a result of these problems, it has become necessary to utilize extremely high melting point metals for the conductor structures within multilayer ceramic circuit boards. For instance, palladium and molybdenum have seen wide use; but both of these metals exhibit rather high electrical resistances in relation to copper and aluminum and are unsuited to high speed circuit applications.

Accordingly, it is an object of this invention to provide an improved multilayer circuit board.

It is another object of this invention to provide an improved multilayer ceramic circuit board.

It is another object of this invention to provide an improved multilayer ceramic circuit board which is adapted to high speed circuit applications.

It is yet another object of this invention to provide an improved method for producing multilayer ceramic circuit boards.

It is still another object of this invention to provide a method for producing multilayer ceramic circuit boards with high conductivity interior conductors.

SUMMARY OF THE INVENTION

In accordance with the above stated objects, a mixture is prepared of a binder material and a metal, or compound thereof which can be chemically converted to the metallic state. This mixture is used to form circuit patterns upon a plurality of sheets of finely divided ceramic particles held together by a heat volatile binder. Communicating holes in the sheets are likewise filled with the mixture, and the sheets are subsequently laminated to juxtapose certain portions of the circuit patterns with the communicating holes. The laminated sheets are then heated to drive off the binders, sinter the ceramic particles, and chemically convert any refractory metal compound to the metal state, the heating step additionally causing the metal or converted compound thereof to form capillary paths in coincidence with the circuit pattern. The sintered structure is then placed in contact with a molten, high conductivity metal to allow the metal to enter the capillary paths and fill them thereby forming the desired high conductivity circuit structure.

BRIEF DESCRIPTION OF THE DRAWING

The foregoing and other objects, features and advantages of the invention will be apparent from the following more particular description of the preferred embodiment of the invention, as illustrated in the accompanying drawings.

In the drawings.

DESCRIPTION OF THE PREFERRED EMBODIMENTS

Figure 1:
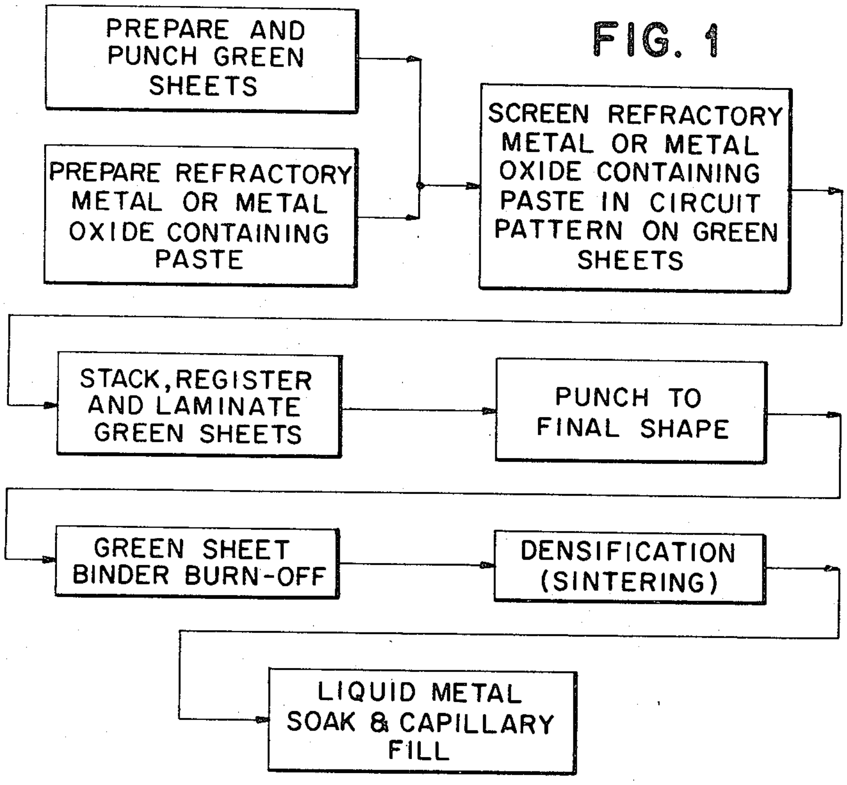
FIG. 1 is a flow chart illustrating the invention.

Referring now to FIG. 1, the process commences with the preparation of ceramic "green" sheets into a form suitable for subsequent metallization. As is well known in the art, the preparation of a ceramic "green" sheet involves the mixing of a finely divided ceramic particulate and other chemical additives with various organic solvents and binders to provide thermoplastic, pliant sheets. Until these sheets are sintered to their dense state, they are termed "green" sheets.

While many types of ceramic green sheets can be employed with this invention, they must satisfy certain criteria. In the preferred embodiment of this invention, the green sheets are sintered in a reducing atmosphere; thus, the basic constituent oxides thereof must not be too easily reduced to the elemental state. For instance, ceramic materials containing lead oxides and titanium oxides are not well suited to this process due to the ease with which these oxides are converted into metallic lead and titanium. As a result, the ceramics containing these metals become either conductive or semiconductive and are thereby rendered useless as insulators.

As aforestated in the introduction, the essence of this invention lies in the formation of metallized capillaries within a multilayer ceramic circuit board, which capillaries are subsequently filled with a high conductivity metal. As will be apparent, some of the materials utilized to provide metallization within these capillaries employ refractory metal oxides which are chemically reduced to the pure metal state during the sintering process. Thus, any ceramic used in this process must sinter at a temperature which is sufficiently high to allow the reduction reaction to occur. Of course, this constriction does not apply where pure metals are utilized to provide the capillary metallization. However, in the latter case, the ceramic material must sinter at a temperature which is sufficiently high to allow the ceramic-to-metal interaction to occur. While the mechanism of adhesion between ceramics and certain metals is not completely understood, much empirical data exists and can be obtained to determine these required temperatures. Of the many types of ceramics which fulfill the above criteria, two of the more desirable are the zirconium alkaline earth porcelains (ZAEP) and the aluminas ($Al_2O_3$). Other ceramics which may also be used are beryllias, forsterites, steatites, mullites, etc.

In addition to the preparation of the green sheets, a metallization paste including a refractory metal, or metals, or metal oxides thereof is prepared. The metallization paste must fulfill at least the following two requirements: 1) upon sintering the ceramic, the residual metal which is left must tightly adhere to and form a metallized surface on the ceramic and 2) the adherent metal must occupy less volume than the predeposited paste to allow for the formation of the capillary structures. Metals which fulfill the first requirement are well known and generally comprise the group of metals found in the refractory group. These metals have high melting temperatures and generally remain in the solid phase during the sintering process. These metals exhibit an affinity for the sintered ceramic surface and bond thereto during the process. Thus, pastes bearing these metals are utilized to form the metallized capillary structures to which subsequently applied high conductivity molten metals can wet to provide the desired circuit conductor. Additionally these refractory metals, by virtue of their high strength bond to the ceramic material, provide hermetic seals which, after the molten conductor is added to the capillaries, completely seal the interior of the circuit package. Some of the metals and their compounds which can be used in this process are as follows, molybdenum, molybdenummanganese, tungsten, titanium, tantalum, zirconium, iron, niobuim, mixtures of these metals, and compounds (e.g., oxides and hydrides) of these metals. In addition the oxides of lithium-molybdenum may be used.

As above stated, the second requirement for the metallization paste is that the actual voume of the paste be substantially greater than its equivalent metal volume. Thus, when the paste is subjected to the high burn-off and sintering temperatures to eliminate the binders and various fillers (while leaving the metallic constituents) the volume occupied by the remaining metallization must be substantially less than the original volume of the paste. This requirement must, however, be balanced by the requirement that sufficient metal content is provided in the paste to allow an adequate metallization of the capillaries to occur to provide a wettable continuous channel. Otherwise, when the high conductivity metal is inserted into the capillaries, the capillary process will be halted by the discontinuities.

The preparation of the paste involves the mixing of a finely divided powder of the metal or oxide thereof with a solvent, and a thickener-binder which provides the desired added volume to the paste. Since the technique used herein for producing the circuit lines upon the green sheets is the cold screen process, the materials used herein lead themselves specifically to that technique, but it should be realized that any of a number of other circuit pattern production processes can be utilized which allow for variations of the paste constituents. It is important, however, that these constituents be of the type which are driven off, at or below the sintering temperature of the ceramic being utilized so that only the residual metallization remains after the process is complated. To further increase the volume of the paste, a filler such as terephthalic acid can be added. This is an example of a subliming solid that is volatile at or below the ceramic sintering temperature but not at the laiminating temperature.

Once the metallization paste and green sheets have been prepared, the pastes are screened upon the green sheets to form the desired circuit patterns. If it is desired to have communicating feed-throughs through the green sheets, it is merely necessary to punch the sheets at the desired locations and fill the resulting holes with the paste.

The paste is dried by placing the sheets in an oven and baking them at a rather low temperature, e.g., 150°F, for 60 minutes. The paste may also be air dried. Once the paste is dry, the various green sheets with their circuit patterns are stacked, registered, and laminated. This involves stacking the green sheets on a registration platen so that prepunched locating holes in the green sheets register with posts on the platen to assure the alignment of the circuit patterns on the various sheets. The platen is then placed in a press and a pressure of 400–800 pounds per sq. inch is applied. The temperature is then elevated to 40°–100°C and is held for 3–10 minutes. The thermoplastic nature of the green sheets causes the various layers to adhere to one another and produce a unitary body.

Figure 2:
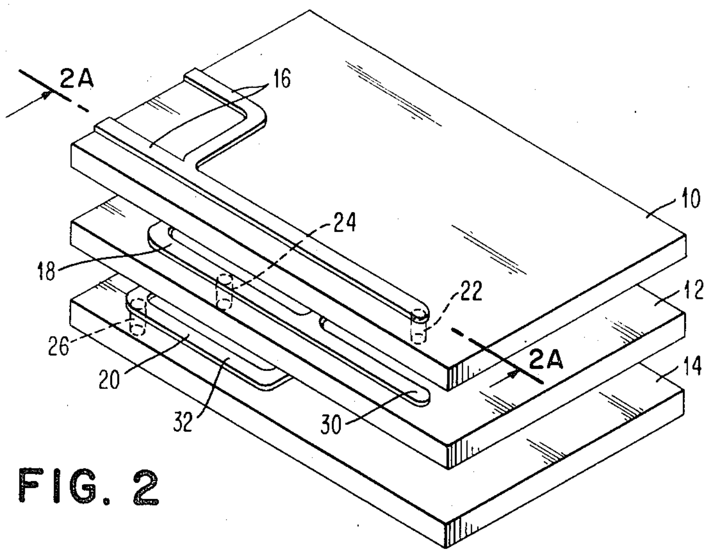
FIG. 2 is an exploded view of a multilayer ceramic circuit package before laminating.
Figure 2A:
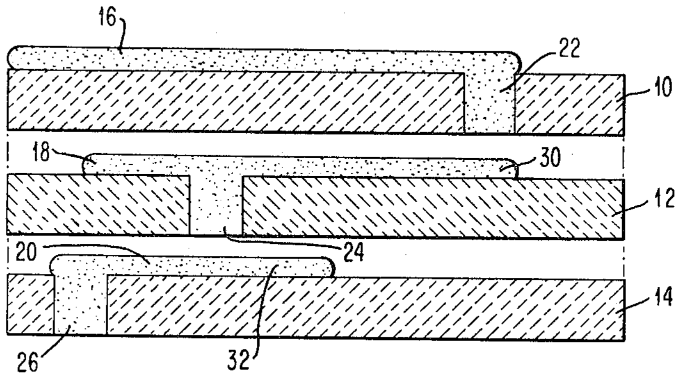
FIG. 2A is a sectional view taken along line 2A—2A in FIG. 2.
Figure 3:
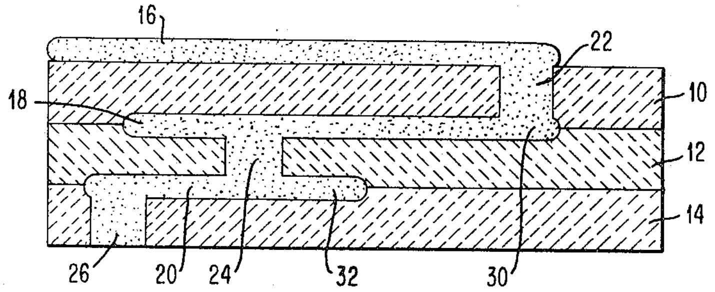
FIG. 3 is a sectional view of a circuit package of FIG. 2 after lamination.

This structure can be better appreciated by referring now to FIGS. 2, 2A, and 3. In FIG. 2, green sheets 10, 12 and 14 have circuitry patterns 16, 18, and 20 printed thereon. In addition, communicating through-holes 22, 24, and 26 are provided in green sheets 10, 12, and 14 respectively. Land portion 30 on green sheet 12 registers with the underside of through-hole 22 and land portion 32 registers with the underside of through-hole 24. As shown in the sectional view of FIG. 2A a circuit path can be traced from green sheet 10 via circuit pattern 16, through through-hoel 22 to land portion 30 on green sheet 12, down through through-hole 24 to land portion 32 on green sheet 14 and then through through-hole 26 in green sheet 14. Once green sheets 10, 12, and 14 have been laminated as shown in FIG. 3, the sheets fuse into an integral whole with the paste circuit patterns buried therein.

After lamination, the structure is allowed to cool to room temperature and is withdrawn from the press. It is then cut or punched to the desired final shape. At this time, additional through-holes may be provided with additional metallization being applied and dried as aforestated. The laminated green sheets are then inserted into a sintering oven and the firing process commenced. This process includes two phases, the first being binder burn-off in an air or reducing atmosphere and the second being densification in a reducing atmosphere. The term "burn-off" is meant to thus include both oxidation and/or volatilization of the binder and solvent materials. During binder burn-off, the temperature is gradually raised to a level which allows the gradual elimination of the binders and solvents contained within the green sheets and the paste. Once the binders and solvents have been eliminated, the furnace is allowed to cool to room temperature.

Assuming that a ZAEP green sheet is used of the general formulation to be hereinafter given, the following burn-off schedule can be employed. The furnace temperature is raised at a rate of 150°C. per hour to a temperature of 400°C. and is kept at 400°C. for three hours. Then, the furnace is allowed to cool at its own rate to room temperature. This gradual burn-off allows the binders to be driven off without creating disruptive pressures within the laminate which might cause damage. Once the laminate has cooled, it is then ready for the densification or sintering operation.

During sintering, the temperature is elevated to a sufficiently high level to densify this ceramic to its final state. This process is carried out in a reducing atmosphere (e.g., hydrogen). If a metal containing paste is used, the reducing atmosphere prevents its oxidation at the sintering temperature. If a metal oxide containing paste is used, the reducing atmosphere chemically converts the oxide to the pure metallic state. It has been found that the reducing atmosphere may also reduce some of the oxides in certain ceramic materials and for this reason, a controlled amount of water vapor may be added during the process to prevent this occurrence.

A typical sintering schedule for a ZAEP substrate is as follows: The furnace temperature is raised from room temperature to 1,285°C. at rates of 200°C. per hour to 800°C. per hour, and the furnace is maintained at 1,285°C. for 3 hours. At the end of the 3 hours, the furnace is then cooled at the same rate at which it was raised in temperature. The burn-off and sintering phases may also be accomplished in one continuous heating cycle to thus eliminate the requirement for cooling at the end of the burn-off period.

Figure 4:
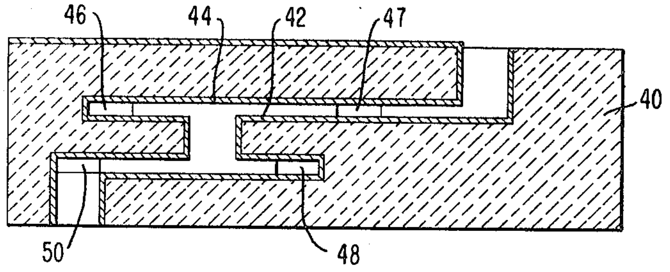
FIG. 4 is a sectional view of the circuit board of FIG. 3 after sintering showing the capillary structure.

It has been observed that two types of capillaries are formed by this process, the first being an actual tube like structure with a coating of metal on its surface and the second being a lattice like structure which is porous or spongy in nature but yet which provides a continuous path through its entire length. While these two structures vary in nature, they both provide the desired capillary function and thereby the desired result. The sintered ceramic with its capillary channel is shown in FIG. 4 (shown idealized). Ceramic 40 is now an integral monolithic structure with capillcary conductive linings 42, 44, etc. embedded therein. Those capillaries which are perpendicular to the plane of the drawing are shown at 46, 47, 48 and 50.

To now accomplish the filling of these capillary structures with a highly conductive liquid metal, merely requires that the ceramic substrate be dipped in a bath of a molten conductor (such as copper or aluminum) in a reduced pressure atmosphere. This atmosphere is used to prevent gas voids from occurring in capillaries which might produce line discontinuities. In other words, when the process is carried out in such an atmosphere, there are insufficient gas molecules to be trapped in a capillary to prevent the liquid metal from entering therein and creating a discontinuous conductor. It is not required that a high vacuum be provided, but merely a vacuum in the order of one mm of mercury.

Figure 5:
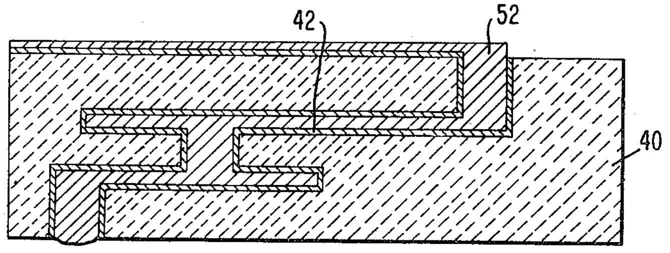
FIG. 5 is a sectional view of the circuit of FIG. 4 after the capillary structures have been filled with a high conductivity metal.

When the substrate is dipped into the molten bath, the molten conductor, via normal capillary forces, enters into the interior of the structure and forms the desired circuits. The finished product is shown in FIG. 5, with conductor material 52 filling all of the capillary channels and also adhering to the surface metallization.

Another technique which may be used to fill the capillaries employs conductor metal preforms which are placed in contact with the points where the capillaries are exposed. If the preforms are subsequently melted, the conductor metal fills the capillaries and forms the desired high conductivity circuit paths.

In the following example, a ZAEP green sheet was used and prepared in the following manner: Ceramic raw materials were weighed and mixed in a ball mill. A typical charge for preparing ZAEP ceramics is:

| | | |
|---|---|---|
| Kaolin | 759 gms | |
| $ZrSiO_4$ | 206 gms | |
| $MgCO_3$ | 86.2 gms | Milling time: 8 hrs. |
| $BaCO_3$ | 201.8 gms | |
| $CaCO_3$ | 99.6 gms | |
| $SrCO_3$ | 150.1 gms | |
| Distilled $H_2O$ | 2500 cc | |

After milling for 8 hours, the slurry was dried, pulverized and then calcined at 1,100°C. for 1 ½ hours. The calcining operation decomposed the carbonates and clay driving off $CO_2$ and $H_2O$ and initiated the chemical reaction process.

Following calcining, the powder was pulverized and micromilled. The resin, solvents, wetting and plasticizing agents were then mixed with the ZAEP calcined ceramic in a ball mill to make the ceramic-organic slurry. A typical batch was as follows:

| | | |
|---|---|---|
| Polyvinyl Butryl | 36.0 gms | |
| Tergitol | 8.0 gms | |
| DiButyl Pthalate | 12.2 gms | Milling time: 9 hrs. |
| 60/40 Toluene/Ethanol | 144.0 gms | |
| Cyclohexanone | 121.0 gms | |
| ZAEP Calcine | 400.0 gms | |

EXAMPLE 1

Four individual ZAEP green sheets were utilized with two small through-holes being punched in the first two sheets (top and second layers) using a 10 mil drill and on the third layer a fine conductor land (10 mil wide) of a refractory metal oxide containing paste was printed. The fourth layer was merely a blank sheet and was used as a backing sheet for the third layer with the line on it. The paste consisted of 40 grams of a finely divided powder of $MoO_3$ (-400 mesh) which was mixed with 13.5 grams of Squeegee medium 163*a* (obtained from the L. Reusche and Co., Newark, New Jersey). This medium contains beta terpenyl (volatile solvent) and ethyl cellulose (thickener and bonder). The constituents were three roll milled into an uniform paste mixture and screened as aforesaid to provide the conductor line and fill the through-holes. After proper registration, the composite structure was laminated and then subjected to a binder turn-off in air at 400°C. with a subsequent firing in a dry hydrogen atmosphere at 1,210°C. for 1 hour. After firing, a cross section of the printed land was made and a hollow capillary observed with the walls of the capillary coated with metallic molybdenum (The reduction production of $MoO_3$). The capillary so formed was subsequently filled by placing the sample for five minutes into a molten copper bath at 1,140°C. in a dry hydrogen atmosphere. A cross section of the copper filled capillary was made and showed that the wetting was excellent, that there were no significant alloys or intermetallic formations and that a generally good conductor structure had been formed.

EXAMPLE 2

In this example, terephthalic acid was added to the paste mixture described in Example 1 to provide additional volume to the paste. The paste consisted of the following: 4.7 grams $MoO_3$, 10.5 grams terephthalic acid, 5.76 grams of the Squeegee medium 163*c*. These constituents were three roll milled into uniform paste mixture and applied as follows: In ten layer laminate of approximately 1 × 1 inch square, 22–10 mil through-holes were punched in the top sheet and 11 parallel conductor lands were printed upon the second sheet. Each of these conductor lands was ten mils wide. The remaining sheets were used for support. The lamination and burn-off procedure was the same as for Example 1 but the sinter firing was done in a moist hydrogen atmosphere with the ceramic substrate being maintained at 1,285°C. for 3 hours. The resultant capillary structure was sectioned and a porous molybdenum capillary structure was observed rather than the hollow capillary structure of Example 1. The ceramic substrate was then immersed in a liquid aluminum bath at 700°C. and the end product sectioned. It was found that continuous, good quality conductive capillaries had been formed with the aluminum adhering to the porous molybdenum structure.

EXAMPLE 3

In the example, a refractory metal combination instead of a refractory metal oxide was utilized to provide the metallization. The following constituents were present in the paste: 3.52 gram Mo (-400 mesh), 0.88 grams Mn (-400 mesh), 5.25 grams terephthalic acid, 4.15 grams Squeegee medium 163*c*. The paste was utilized with a similar package configuration as used for Example 2 and identical burn and sinter cycles employed. The resulting product was sectioned and capillaries were found to be the same as that formed in Example 2.

EXAMPLE 4

In this example, the terephthalic acid was eliminated from the paste of Example 3 and the process repeated. The following constituents were present in the paste: 18.5 grams Mo, 1.5 grams Mn, 5 grams of Squeegee medium 163*c*. The paste was prepared, printed, dried, the green sheets laminated, burned off, and sintered in an identical manner as that employed for Examples 2 and 3. A porous molybdenum-manganese structure such as that found in Example 3 was found for this sample. This structure was then soaked in a copper bath. The capillaries formed were much the same as that described for Example 2.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method for manufacturing a multilayer ceramic circuit board with interconnected conductors disposed in different layers, said method comprising the steps of:

preparing a plurality of green ceramic sheets of ceramic material dispersed in a heat volatile binder;

forming holes at predetermined locations in said sheets;

preparing a paste composition comprising a metallizing media dispersed in a heat volatile binder, said media being selected from the group consisting of refractory metals and compounds thereof which density when sintered at a temperature higher than the temperature at which said ceramic densifies when sintered;

depositing said paste composition on surface areas of said green sheets including surface areas within said holes;

stacking said sheets one upon another in registry such that patterns on and holes in different sheets are superposed in a desired circuit pattern;

laminating said sheets;

heating said laminate at a temperature high enough to drive off said binders, sinter said ceramic to a dense state and bond said metal to said ceramic but lower than a temperature at which said metal densifies when sintered to form thereby a continuous porous metallic capillary path in coincidence with said circuit pattern; and filling said capillary path with a molten conductor in a reduced pressure atmosphere to complete said circuit pattern.

2. The method as defined in claim 1 wherein said paste composition further includes a solid material that is not volatile at the laminating temperature of said sheets but is at the temperature at which said sheets are sintered.

3. The method defined by claim 1 wherein said metallizing media comprises a minor proportion by volume, of the total solids of said paste composition.

4. The method according to claim 1 wherein said metallizing media is selected from the group consisting of molybdenum, molybdenum-manganese, tungsten, titanium, tantalum, zirconium, iron, niobium and compounds thereof, and said molten conductor is selected from the group consisting of aluminum and copper.

5. The method according to claim 1 wherein said heating is carried out in a reducing atmosphere.

6. The method as defined in claim 1 wherein said reducing atmosphere has water added thereto to prevent the oxidization of the ceramic particles in said sheets.

7. The method according to claim 6 wherein said metallizing media includes an oxide compound of the metal which reduces to the metal during the heating step.

* * * * *